(12) United States Patent
Ito et al.

(10) Patent No.: US 7,816,014 B2
(45) Date of Patent: Oct. 19, 2010

(54) LIQUID CRYSTALLINE POLYESTER AND FILM USING THE SAME

(75) Inventors: Toyonari Ito, Tsukuba (JP); Tomoya Hosoda, Tsukuba (JP); Satoshi Okamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 453 days.

(21) Appl. No.: 11/331,023

(22) Filed: Jan. 13, 2006

(65) Prior Publication Data

US 2006/0160987 A1    Jul. 20, 2006

(30) Foreign Application Priority Data

Jan. 18, 2005   (JP) .............................. 2005-009950

(51) Int. Cl.
*B32B 27/06* (2006.01)
*B32B 27/36* (2006.01)
*C08G 63/06* (2006.01)
*C08G 63/127* (2006.01)
*C08G 63/133* (2006.01)

(52) U.S. Cl. ........................ 428/480; 428/457; 428/458; 528/176; 528/190; 528/193; 528/203; 528/212; 528/218; 528/272; 528/298; 528/300; 528/302; 528/305; 528/308; 528/308.6

(58) Field of Classification Search ........................ None
See application file for complete search history.

(56) References Cited

U.S. PATENT DOCUMENTS

| | | | | |
|---|---|---|---|---|
| 4,224,433 A * | 9/1980 | Calundann et al. | ........... | 528/128 |
| 4,390,681 A * | 6/1983 | Deex | ........................... | 528/193 |
| 4,395,307 A * | 7/1983 | Kastelic et al. | .......... | 162/157.3 |
| 4,447,593 A * | 5/1984 | Funakoshi et al. | .......... | 528/176 |
| 5,183,878 A * | 2/1993 | Kanaka et al. | ............... | 528/193 |
| 5,326,848 A * | 7/1994 | Kashimura et al. | .......... | 528/190 |
| 5,391,689 A * | 2/1995 | Kageyama et al. | .......... | 528/193 |
| 5,525,700 A * | 6/1996 | Samuels et al. | ............. | 528/190 |
| 5,646,209 A * | 7/1997 | Furuta et al. | ................. | 524/252 |
| 6,680,002 B2 * | 1/2004 | Yamauchi et al. | ....... | 252/299.01 |
| 6,755,992 B2 * | 6/2004 | Okamoto et al. | ....... | 252/299.67 |
| 6,797,345 B2 * | 9/2004 | Okamoto et al. | ............. | 428/1.6 |
| 6,815,526 B2 * | 11/2004 | Yokota et al. | ................. | 528/272 |
| 6,838,018 B2 * | 1/2005 | Okamoto et al. | ....... | 252/299.01 |
| 6,838,546 B2 * | 1/2005 | Okamoto et al. | ............. | 528/495 |
| 6,846,433 B2 * | 1/2005 | Okamoto et al. | ....... | 252/299.01 |
| 6,858,701 B2 * | 2/2005 | Sakurai et al. | ............... | 528/272 |
| 7,005,497 B2 * | 2/2006 | Ohtomo et al. | ............. | 528/308 |
| 7,009,026 B2 * | 3/2006 | Okamoto et al. | ............. | 528/190 |
| 7,014,921 B2 * | 3/2006 | Okamoto et al. | ............. | 428/480 |
| 7,022,413 B2 * | 4/2006 | Katagiri et al. | ............. | 428/480 |
| 7,022,807 B2 * | 4/2006 | Okamoto et al. | ............. | 528/308 |
| 7,063,892 B2 * | 6/2006 | Okamoto et al. | ......... | 428/423.4 |
| 7,211,528 B2 * | 5/2007 | Katagiri et al. | ............. | 442/117 |
| 2004/0152865 A1 * | 8/2004 | Okamoto et al. | ............. | 528/302 |
| 2005/0276975 A1 * | 12/2005 | Katagiri et al. | ............. | 428/357 |
| 2007/0057236 A1 * | 3/2007 | Hosoda et al. | ............. | 252/500 |
| 2007/0092709 A1 * | 4/2007 | Okamoto et al. | ......... | 428/297.4 |
| 2007/0187643 A1 * | 8/2007 | Seo et al. | ................ | 252/299.01 |
| 2007/0293633 A1 * | 12/2007 | Hosoda et al. | .............. | 525/390 |

FOREIGN PATENT DOCUMENTS

| | | | |
|---|---|---|---|
| EP | 0 323 160 | * | 7/1989 |
| EP | 0 350 222 | * | 1/1990 |
| EP | 0 366 846 | * | 5/1990 |
| JP | 2002-179776 | * | 6/2002 |
| JP | 2002-179776 A | | 6/2002 |

* cited by examiner

*Primary Examiner*—Vivian Chen
(74) *Attorney, Agent, or Firm*—Sughrue Mion, PLLC

(57) ABSTRACT

The present invention provides a liquid crystalline polyester comprising (a) a repeating unit derived from aromatic hydroxycarboxylic acid, (b) a repeating unit derived from aromatic dicarboxylic acid and (c) a repeating unit represented by —X—Ar1—O—Ar1—Y—, wherein Ar1 represents 1,4-phenylene which may be substituted by a halogen atom, an alkyl group having 1 to 10 carbon atoms or an aryl group having 6 to 20 carbon atoms, and X and Y independently represent O or NH. The polyester in the preset invention has a sufficiently low dielectric constant and/or is a sufficiently high resistance in hydrolysis.

14 Claims, No Drawings

LIQUID CRYSTALLINE POLYESTER AND FILM USING THE SAME

BACKGROUND OF THE INVENTION

1. Field of the Invention

The present invention relates to a liquid crystalline polyesters and a film using the same.

2. Description of the Related Art

Liquid crystalline polyester is widely used for electronic components such as printed wiring boards because of its low dielectric constant, high mechanical strength, superior heat resistance and superior thin-wall moldability. In association with request for reduction in thickness of electronic components, there is a demand for materials having further reduced dielectric constants. The present inventors have already proposed a liquid crystalline polyester comprising structural units derived from 2-hydroxy-6-naphthoic acid, aromatic diol and aromatic dicarboxylic acid (see JP-A-2004-196930), which include a liquid crystalline polyester comprising 4,4'-dihydroxybiphenyl as an aromatic diol.

SUMMARY OF THE INVENTION

One of objects of the present invention is to provide a liquid crystalline polyester having a further reduced dielectric constant and/or a further high resistance in hydrolysis compared to the conventional liquid crystalline polyester.

The present inventors diligently studied constituents of liquid crystalline polyester and, as a result, found that when 4,4'-dihydroxydiphenyl ether is used instead of 4,4'-dihydroxybiphenyl, the resulting liquid crystalline polyester has a further reduced dielectric constant and, unexpectedly, it is superior in hydrolysis resistance. The inventors made some more investigations, thereby accomplishing the present invention.

The present invention provides a liquid crystalline polyester comprising (a) a repeating unit derived from aromatic hydroxycarboxylic acid, (b) a repeating unit derived from aromatic dicarboxylic acid and (c) a repeating unit represented by formula (1) below:

$$—X—Ar1-O—Ar1-Y— \qquad (1)$$

wherein Ar1 represents 1,4-phenylene which may be substituted by a halogen atom, an alkyl group having 1 to 10 carbon atoms or an aryl group having 6 to 20 carbon atoms, and X and Y independently represent O or NH.

For example, the present invention provides a liquid crystalline polyester comprising a repeating unit represented by formula ($A_3$), at least one repeating unit selected from units represented by formula ($B_1$) and ($B_3$) respectively, and a repeating unit represented by formula ($C_1$), each unit shown below:

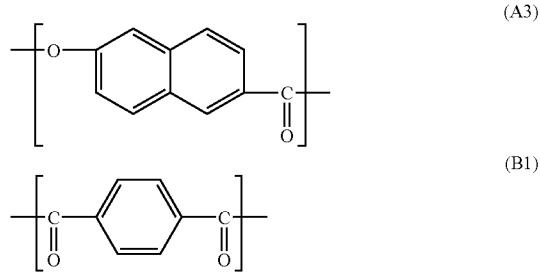

(A3)

(B1)

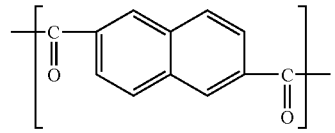

(B3)

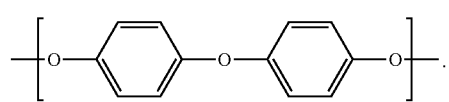

(C1)

Further, the present invention provides a film comprising the liquid crystalline polyester described above; and a liquid composition comprising the above-described liquid crystalline polyester and a solvent.

Moreover, the present invention provides a film obtained by casting the above-mentioned liquid composition on a support, removing the solvent, carrying out heat treatment, and then peeling away the support.

Furthermore, the present invention provides a laminate comprising a layer composed of any one of the above-mentioned films.

The liquid crystalline polyester in the present invention has a low dielectric constant and/or is superior in hydrolysis resistance. Therefore, the film obtained from the liquid crystalline polyester also has a low dielectric constant and/or is superior in hydrolysis resistance. The laminate comprising a layer composed of the film is useful from industrial point of view because it can be effectively used in the electric and electronic fields for printed wiring boards such as embeddeds, film carriers, high density magnetic tape materials, electric wire covering materials, film capacitors, etc.

DETAILED DESCRIPTION OF THE PREFERRED EXAMPLES

A liquid crystalline polyester in the present invention comprises (a) a repeating unit derived from aromatic hydroxycarboxylic acid, (b) a repeating unit derived from aromatic dicarboxylic acid and (c) a repeating unit represented by formula (1) below:

$$—X—Ar1-O—Ar1-Y— \qquad (1).$$

In formula (1), Ar1 represents 1,4-phenylene which may be substituted by a halogen atom, an alkyl group having 1 to 10 carbon atoms or an aryl group having 6 to 20 carbon atoms and, X and Y independently represent O or NH. Examples of the repeating unit represented by formula (1) include repeating units represented by formulas ($C_1$) to ($C_3$) below.

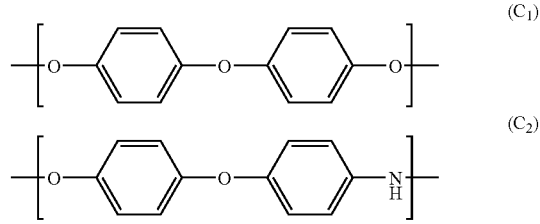

($C_1$)

($C_2$)

-continued

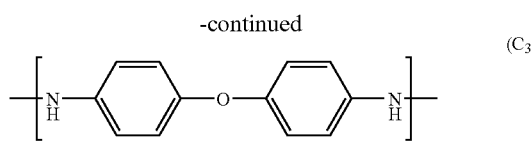
(C₃)

The repeating units represented by formulas $(C_1)$ to $(C_3)$ may be substituted by a halogen atom, an alkyl group having 1 to 10 carbon atoms or an aryl group having 6 to 20 carbon atoms.

The repeating unit represented by formula $(C_1)$ is a repeating unit derived from an aromatic diol. The repeating unit (c) represented by formula $(C_2)$ is a repeating unit derived from an aromatic amine having a phenolic hydroxyl group. The repeating unit represented by formula $(C_3)$ is a repeating unit derived from an aromatic diamine. Among these, the repeating unit represented by formula $(C_1)$ is preferred because of its high resistance in hydrolysis.

Examples of the repeating unit (a) derived from aromatic hydroxycarboxylic acid include units represented by formulas $(A_1)$ to $(A_5)$ below:

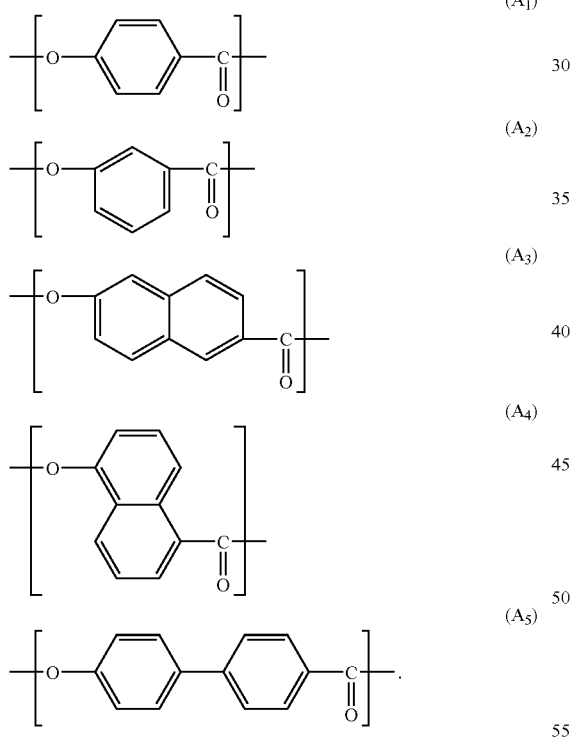

The repeating units represented by formulas $(A_1)$ to $(A_5)$ may be substituted by a halogen atom, an alkyl group having 1 to 10 carbon atoms or an aryl group having 6 to 20 carbon atoms.

Two or more of repeating units (a) may be used together in a liquid crystalline polyester in the present invention. Among those listed above, at least one selected from the group consisting of units $(A_1)$, $(A_3)$ and $(A_5)$ is preferably used. From the viewpoint of dielectric characteristics, unit $(A_3)$ is more preferably used.

Examples of the repeating unit (b) derived from aromatic dicarboxylic acid include units represented by formulas $(B_1)$ to $(B_8)$ below:

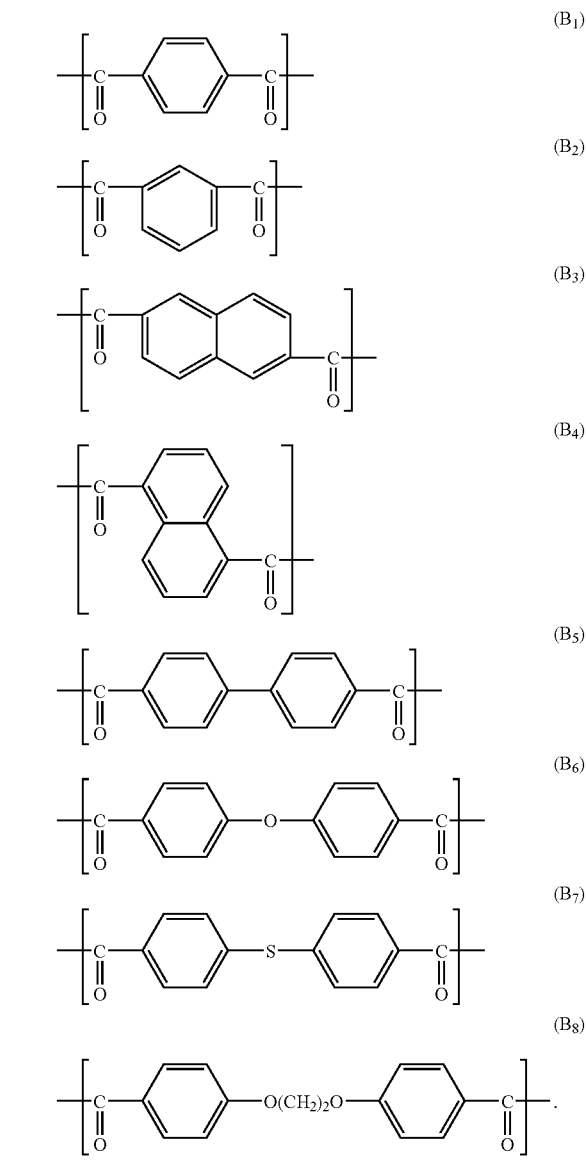

The repeating units represented by formulas $(B_1)$ to $(B_8)$ may be substituted by a halogen atom, an alkyl group having 1 to 10 carbon atoms or an aryl group having 6 to 20 carbon atoms.

Two or more of repeating units (b) may be used together in a liquid crystalline polyester in the present invention. Among those listed above, at least one selected from the group consisting of units $(B_1)$, $(B_2)$, $(B_3)$, $(B_5)$ and $(B_6)$ is preferably used. From the viewpoints of dielectric characteristics and hydrolysis resistance, units $(B_1)$ and $(B_3)$ are more preferably used, and unit $(B_3)$ are most preferably used.

One of preferable liquid crystalline polyesters in the present invention is a liquid crystalline polyester comprising a repeating unit represented by formula $(A_3)$, at least one repeating unit selected from units represented by formula $(B_1)$ and $(B_3)$ respectively, and a repeating unit represented by formula $(C_1)$.

Preferred is a liquid crystalline polyester wherein the molar amounts of units (a), (b) and (c) are from 30 to 80 mol %, from 35 to 10 mol % and from 35 to 10 mol %, respectively, each based on the total molar amount of units (a), (b) and (c). More preferred is a liquid crystalline polyester wherein the molar amounts of units (a), (b) and (c) are from 40 to 70 mol %, from 30 to 15 mol % and from 30 to 15 mol %, respectively. Even more preferred is a liquid crystalline polyester wherein the molar amounts of units (a), (b) and (c) are from 45 to 65 mol %, from 27.5 to 17.5 mol % and from 27.5 to 17.5 mol %, respectively.

Again, preferred is a liquid crystalline polyester wherein the molar amounts of repeating unit ($A_3$) as unit (a) is from 30 to 80 mol %, the total amount of repeating units ($B_1$) and ($B_3$) as unit (b) is from 35 to 10 mol %, and the amount of repeating unit ($C_1$) as unit (c) is from 35 to 10 mol %, each based on the total molar amount of ($A_3$), ($B_1$), ($B_3$) and ($C_1$).

When the molar amount of unit (a) is more than 80 mol % or the molar amount of unit (b) or (c) is less than 10 mol % based on the total molar amount of (a), (b) and (c), the solubility of the resulting liquid crystalline polyester in a solvent tends to decrease. When the molar amount of (a) is less than 30 mol % or the molar amount of (b) or (c) is more than 35 mol %, the liquid crystallinity of the resulting liquid crystalline polyester tends to decrease.

It is preferable that units (b) and (c) be used in substantially the same amount, although the degree of polymerization of a liquid crystalline polyester can be controlled by increasing or decreasing the amount of one type of repeating units relative to that of the other type of repeating units.

In addition to the aforementioned repeating units (a), (b) and (c), the liquid crystalline polyester in the present invention may further include (d) a repeating unit represented by formula (2):

—X—Ar2-Y—  (2)

In formula (2), Ar2 represents 2,6-naphthylene, 1,4-phenylene, 1,3-phenylene or 4,4'-biphenylene, which may be substituted by a halogen atom, an alkyl group having 1 to 10 carbon atoms or an aryl group having 6 to 20 carbon atoms; and X and Y independently represent O or NH. Examples of the repeating unit represented by formula (2) include the repeating units represented by formulas ($C_4$) to ($C_6$) below:

  ($C_4$)

  ($C_5$)

  ($C_6$)

The repeating units represented by formulas ($C_4$) to ($C_6$) may be substituted by a halogen atom, an alkyl group having 1 to 10 carbon atoms or an aryl group having 6 to 20 carbon atoms.

Unit ($C_4$) is a repeating unit derived from an aromatic diol. Unit ($C_5$) is a repeating unit derived from an aromatic amine having a phenolic hydroxyl group. Unit ($C_6$) is a repeating unit derived from an aromatic diamine.

When a liquid crystalline polyester of the present invention includes unit (d), it is preferred that the liquid crystalline polyester include at least one of the repeating units represented by formulas ($C_7$) to ($C_{12}$) below:

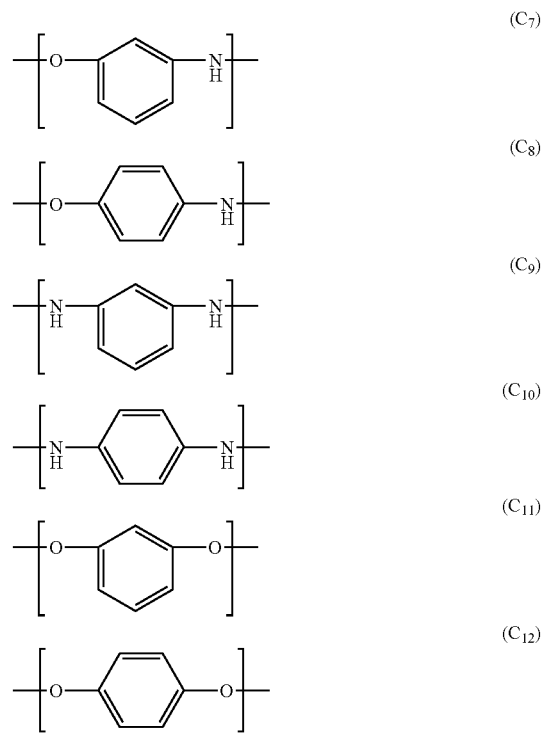

Unit ($C_7$) to ($C_{12}$) may be substituted by a halogen atom, an alkyl group having 1 to 10 carbon atoms or an aryl group having 6 to 20 carbon atoms.

Among units ($C_7$) to ($C_{12}$), unit ($C_8$) is most preferably used.

Examples of the halogen atom as one of the optional substituents on the repeating units represented by units ($A_1$) to ($A_5$), units ($B_1$) to ($B_8$) units ($C_1$) to ($C_{12}$) include a fluorine atom, a chlorine atom, a bromine atom and an iodine atom are typically used. In particular, a fluorine atom and a chlorine atom are preferred. Typical examples of the alkyl group having 1 to 10 carbon atoms as one of the optional substituents on the repeating units include a methyl group, an ethyl group, a propyl group or a butyl group. Typical examples of the aryl group having 6 to 20 carbon atoms as one of the optional substituents on the repeating units include a phenyl group.

When repeating unit (d) represented by formula (2) is used in a liquid crystalline polyester in the present invention, it is preferred that the amount of repeating unit (c) is reduced and the repeating unit (d) is used instead. That is, the repeating unit (d) may be utilized so as to replace part of repeating unit (c) represented formula (1). For example, the unit (d) is used so as to make up about 0.1% by mole to about 50% by mole of the repeating unit (c).

By using unit (d), it tends to easily control the solubility of the liquid crystalline polyester of the present invention in a solvent.

Although the liquid crystalline polyester of the present invention includes the aforementioned repeating units (a), (b) and (c) and the optional (d), it may further include other types of repeating units unless properties of the polyester is impaired.

Next, examples of methods for producing the liquid crystalline polyester in the present invention are described below, which should not be construed as a limitation upon the scope of the present invention.

Aromatic hydroxycarboxylic acids, aromatic dicarboxylic acids, aromatic diamines, aromatic amines having a phenolic hydroxyl group, aromatic diols, and the like, which can constitute the aforementioned repeating units, can be used as raw materials. Moreover, ester-forming or amide-forming derivatives thereof may also be used instead of them.

Examples of the ester-forming derivatives of the carboxylic acids include compounds in which a carboxyl group has formed its derivative having high reactivity for transesterification reaction, such as acid chloride and acid anhydride, which can promote polyester forming reaction, and compounds in which a carboxyl group has formed an ester together with an alcohol, ethyleneglycol, or the like which can form polyester through transesterification reaction.

Furthermore, examples of the ester-forming derivative of a phenolic hydroxyl group include derivatives in which a phenolic hydroxyl group has formed an ester together with a carboxylic acid so that the ester can form polyester through transesterification reaction.

Examples of the amide-forming derivatives of an amino group include derivatives in which an amino group has formed amide together with a carboxylic acid so that the amide can form polyamide through transamidation reaction.

The liquid crystalline polyester in the present invention can be produced, for example, by a method involving acylating the aforementioned raw material with an excess amount of aliphatic carboxylic anhydride to obtain an acylated product, and then polymerizing the resulting acylated product with an aromatic hydroxycarboxylic acid and/or an aromatic dicarboxylic acid through transesterification. An acylated aliphatic carboxylate ester, which can be prepared in advance by acylation, may be used as the acylated product (see, JP-A-2002-220444 and 2002-146003).

In acylation reaction, the amount of the aliphatic carboxylic anhydride added is preferably 1.0 to 1.2 times equivalent, more preferably 1.05 to 1.1 times equivalent, to the total amount of phenolic hydroxyl groups and amino groups. When the amount of aliphatic carboxylic anhydride added is too less, clogging of pipes or the like of a reaction apparatus tends to occur easily during the polymerization by transesterification due to sublimation of the acylated product, aromatic hydroxycarboxylic acid, aromatic dicarboxylic acid, etc. On the other hand, when the amount of aliphatic carboxylic anhydride is too much, a considerably colored liquid crystalline polyester may be produced.

The acylation reaction is preferably performed at a temperature from 130° C. to 180° C. for a time from 5 minutes to 10 hours, and more preferably at a temperature from 140° C. to 160° C. for a time from 10 minutes to 3 hours.

The aliphatic carboxylic anhydride used for the acylation reaction is not particularly restricted and examples thereof include acetic anhydride, propionic anhydride, butyric anhydride, isobutyric anhydride, valeic anhydride, pivalic anhydride, 2-ethyl hexanoic anhydride, monochloroacetic anhydride, dichloroacetic anhydride, trichloroacetic anhydride, monobromoacetic anhydride, dibromoacetic anhydride, tribromoacetic nhydride, monofluoroacetic anhydride, difluoroacetic anhydride, trifluoroacetic anhydride, glutaric anhydride, maleic anhydride, succinic anhydride and β-bromo propionic anhydride. These may be used in combination. In view of price and handling property, acetic anhydride, propionic anhydride, butyric anhydride and isobutyric anhydride are preferable, and acetic anhydride is more preferable.

In the polymerization by transesterification, the amount of acyl groups in the acylated product is preferably 0.8 to 1.2 times equivalent of that of carboxyl groups. The polymerization temperature is preferably 400° C. or lower, and more preferably 350° C. or lower. The heating rate until the temperature is increased to the polymerization temperature is preferably 0.1 to 50° C./min, and more preferably 0.3 to 5° C./min. In order to promote the polymerization, it is desirable to distill aliphatic carboxylic acid produced as a by-product and unreacted aliphatic carboxylic anhydride out of the system, for example, by evaporation.

The acylation reaction and the polymerization by transesterification may be performed in the presence of a catalyst. As the catalyst, catalysts conventionally known as catalysts for polymerization of polyesters may be used. Examples thereof include metal salt catalysts such as magnesium acetate, stannous acetate, tetrabutyl titanate, lead acetate, sodium acetate, potassium acetate and antimony trioxide; and organic compound catalysts such as N,N-dimethylaminopyridine and N-methylimidazole. Among these catalysts, preferred are heterocyclic compounds including two or more nitrogen atoms, such as N,N-dimethylaminopyridine and N-methylimidazole, which may preferably be used (see, JP-A-2002-146003). The catalyst may be typically caused to be present during the acylation reaction and it is not necessary to remove it after the acylation reaction. When the catalyst is not removed, the next treatment may be performed while the catalyst is allowed to remain as it is. Moreover, when the next treatment is performed, a catalyst as previously mentioned may be further added.

Polymerization by transesterification can be typically performed by melt polymerization, and melt polymerization and solid phase polymerization may be used in combination. The solid phase polymerization may be carried out by extracting a polymer from a melt polymerization process, solidifying the polymer, then grinding it into powder form or flake form, and subsequently subjecting it to a known solid phase polymerization method. One of examples is a method in which heat treatment is carried out in a state of solid phase under inert atmosphere, such as nitrogen, at a temperature from 20° C. to 350° C. for 1 to 30 hours. The solid phase polymerization may be performed, with agitation or without agitation in a state of still standing. Moreover, a single reaction vessel can serve as both a melt polymerization vessel and a solid-phase polymerization vessel when it has an appropriate agitating mechanism. After the solid phase polymerization, the resulting liquid crystalline polyester may be pelletized by a conventional method for use.

The production of the liquid crystalline polyester of the present invention may be performed, for example, by use of a batch apparatus, a continuous apparatus, or the like.

The liquid crystalline polyester may contain known filler, additives, thermoplastic resin, etc. as long as the properties of the liquid crystalline polyester of the present invention are not impaired. Examples of the filler include an organic filler such as epoxy resin powder, melamine resin powder, urea resin powder, benzoguanamine resin powder and styrene resin; and an inorganic filler such as silica, alumina, titanium oxide, zirconia, kaolin, calcium carbonate, calcium phosphate, aluminum borate, potassium titanate, magnesium sulphate, zinc oxide, silicon carbide, silicon nitride, glass fiber and alumina fiber. Examples of the additives include coupling agents, sedimentation inhibitors, UV absorbents and heat stabilizers. Examples of the thermoplastic resin include polypropylene, polyamide, polyester, polyphenylene sulfide, polyetherketone, polycarbonate, polyethersulfone, polyphenylether and modified compounds thereof, polyether imide and elastomers, such as copolymers of glycidyl methacrylate and polyethylene.

Next, a description is made to examples of methods for preparing the liquid composition in the present invention using the above-mentioned liquid crystalline polyester and a solvent, which also should not be construed as a limitation upon the scope of the present invention.

Examples of the solvent for use in the preparation of the liquid composition of the present invention include solvents including an aprotic solvent and/or a protic solvent.

Examples of the aprotic solvent include halogen-containing solvents such as methylene chloride, 1-chlorobutane, chlorobenzene, 1,1-dichloroethane, 1,2-dichloroethane, chloroform and 1,1,2,2-tetrachloroethane; ether solvents such as diethyl ether, tetrahydrofuran and 1,4-dioxane; ketone solvents such as acetone and cyclohexanone; ester solvents such as ethyl acetate, lactone solvents such as γ-butyrolactone; carbonate solvent such as ethylene carbonate and propylene carbonate; amine solvents such as triethylamine and pyridine; nitrile solvents such as acetonitrile and succinonitrile; amide solvents such as N,N'-dimethylformamide, N,N'-dimethylacetamide, tetramethylurea and N-methylpyrrolidone; nitro-containing solvents such as nitromethane and nitrobenzene; sulfide solvents such as dimethyl sulfoxide and sulfolane; and phosphoric acid solvents such as hexamethylphosphoramide and tri(n-butyl) phosphate.

Among the above-listed aprotic solvents, amide solvents such as N,N'-dimethylformamide, N,N'-dimethylacetamide, tetramethylurea and N-methylpyrrolidone are preferred because they easily dissolve liquid crystalline polyester. N,N'-dimethylacetamide and N-methylpyrrolidone are more preferred. The aprotic solvent is typically included in the whole solvent in an amount of 30% by weight or more, preferably 60% by weight or more, and more preferably 99% by weight or more because it easily dissolves liquid crystalline polyester.

The amount of the aprotic solvent used with respect to the liquid crystalline polyester may be chosen appropriately depending on the application. In typical cases, 0.01 to 100 parts by weight of the liquid crystalline polyester is used for 100 parts by weight of the aprotic solvent. When the amount of the liquid crystalline polyester is less than 0.01 parts by weight, the viscosity of the liquid composition may be too low and, when a film is produced, the resulting film tends not to be uniform in thickness. when the amount of the liquid crystalline polyester is over 100 parts by weight, it may be difficult for the liquid crystalline polyester to dissolve. In view of handling property and economics, the amount of the liquid crystalline polyester based on 100 parts by weight of the aprotic solvent is preferably 1 to 50 parts by weight, and more preferably 2 to 40 parts by weight.

Examples of the protic solvent include solvents having a phenolic hydroxyl group. Solvents including a halogen-substituted phenol compound represented by formula (L$_1$) below:

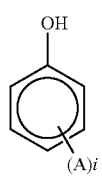

(L$_1$)

(wherein A represents a hydrogen atom or a trihalogenated methyl group, and i represents an integer number of from 1 to 5, and provided that when i is 2 or more, a plurality of As may be the same or different) is preferably used since the liquid crystalline polyester in the present invention can be easily dissolved therein.

Examples of the halogen atom include a fluorine atom, a chlorine atom, a bromine atom and an iodine atom. Because liquid crystalline polyester is dissolved easily, a fluorine atom and a chlorine atom are preferred. In this case, examples of the halogen-substituted phenol compound include pentafluorophenol, tetrafluorophenol, o-chlorophenol and p-chlorophenol. O-Chlorophenol and p-chlorophenol are preferable, and particularly preferred is p-chlorophenol. The protic solvent is typically included in the whole solvent in an amount of 30% by weight or more, preferably 60% by weight or more, and more preferably 99% by weight or more because it easily dissolve liquid crystalline polyester.

The amount of the protic solvent used with respect to the liquid crystalline polyester may be chosen appropriately depending on the application. For example, in typical cases, 0.01 to 100 parts by weight of the liquid crystalline polyester may be used for 100 parts by weight of the protic solvent. When the amount of the liquid crystalline polyester is less than 0.01 parts by weight, the viscosity of the liquid composition may be low and, when a film is produced, the resulting film tends not to be uniform in thickness. When the amount of the liquid crystalline polyester is over 100 parts by weight, it may be difficult for the liquid crystalline polyester to dissolve. In view of handling property and economics, the amount of the liquid crystalline polyester based on 100 parts by weight of the protic solvent is preferably 0.5 to 50 parts by weight, and more preferably 1 to 10 parts by weight.

As a solvent, a mixture of a protic solvent and an aprotic solvent may be also used. For example, a mixture of the aforementioned protic solvent and an aprotic solvent like the aforementioned halogen-containing solvent may be used.

The liquid composition in the present invention is preferably preserved and casted so that the crystals of the polyester is not formed during the storage or casting, which will be described later.

The film of the present invention can be obtained by casting one of the aforesaid liquid compositions on a support, removing the solvent, carrying out heat treatment, and then peeling away the support, which is preferably followed by heat treatment under nitrogen atmosphere within a temperature range from 200° C. to 450° C. Examples of the support include glass and an electric conductor. Examples of such electric conductor include plate or foil of metal such as gold, silver, copper, aluminum and nickel. Copper foil is preferable.

Examples of the method for casting the liquid composition on a support include a method in which the liquid composition is, if necessary, filtered through a filter or the like to remove foreign materials contained in the liquid composition, and then casting the liquid composition uniformly on the support so as to form a smooth surface by roller coating, dip coating, spray coating, spinner coating, curtain coating, slot coating, screen printing, bar coating methods or the like.

Removal of the solvent can be carried out typically by a method including evaporation of the solvent. The method for evaporating the solvent may be heating, pressure reduction, ventilation or the like. In particular, in view of production efficiency and handling property, it is preferred to vaporize the solvent by heating. It is more preferred to vaporize it by heating under ventilation. Regarding the temperature and the time, the evaporation preferably comprises a step for preliminarily drying at a temperature from 50° C. to 100° C. for a time from 10 minutes to 2 hours and a step of heat treatment at a temperature from 200 to 450° C. for a time from 30 minutes to 6 hours.

In view of film formability and mechanical characteristics, the so-obtained film typically has a thickness of 0.5 to 500 μm and, in view of handling property, it is preferably 1 to 100 μm.

In addition, the laminate of the present invention including a layer of an electric conductor and a layer of film can be produced as follows by using the film in the present invention. It is possible to produce the laminate in the present invention by applying a solution including adhesive to an electric conductor such as copper foil with a reverse roll coater, a comma coater, a die coater or the like, drying it under conditions, for example, from 80° C. to 120° C. for 3 to 10 minutes, thereby producing an electric conductor coated with the adhesive in a thickness of, for example, about 10 μm to about 40 μm, subsequently laminating this resultant with a film of the present invention and heat pressing with a roll laminater, followed, if necessary, by post curing to harden the adhesive completely. Alternatively, a laminate may also be produced in the same manner as that mentioned above except applying adhesive to a film of the present invention and then laminating this with an electric conductor. Examples of the adhesives include resins made of epoxy, phenol, polyester, NBR, acryl, polyimide, etc.

Moreover, the laminate of the present invention can also be produced by casting a liquid composition of the present invention on an electric conductor such as copper foil, heat treating it, and then not conducting peeling away of the electric conductor. Furthermore, the laminate in the present invention can also be produced by using a method in which electric conductor is applied on a film of the present invention by vapor deposition, thereby forming a layer of the electric conductor on a layer of the film. Examples of the method of the vapor deposition include ion beam sputtering, high-frequency sputtering, DC sputtering and glow discharging methods.

A printed wiring board can be produced by drawing a desired circuit on the copper foil in the laminate of the present invention by use of resist, carrying out etching for dissolving away the copper under acidic conditions, forming a copper circuit by removing the resist, and then laminating a cover film on the copper circuit. The film of the present invention can be used as the cover film.

As mentioned above, a film of the liquid crystalline polyester in the present invention can be produced by, for example, utilizing the liquid composition of the liquid crystalline polyester. The resulting film may be a sheet-like article including extremely thin film and thick film. Also, in the present invention, articles (such as molded articles) having other forms (for example, in the forms of containers such as bottles) comprising the liquid crystalline polyester in the present invention can be produced by known methods.

The invention being thus described, it will be apparent that the same may be varied in many ways. Such variations are to be regarded as within the spirit and scope of the invention, and all such modifications as would be apparent to one skilled in the art are intended to be within the scope of the following claims.

The entire disclosure of the Japanese Patent Application No. 2005-9950 filed on Jan. 18, 2005 including specification, claims and summary, are incorporated herein by reference in their entirety.

EXAMPLES

The present invention is described in more detail by following Examples, which should not be construed as a limitation upon the scope of the present invention.

The hydrolysis resistance was evaluated by the following pressure cooker test.

A 0.3-mm thick specimen molded was prepared using a liquid crystalline polyester powder. Then, a tensile strength was measured with a pressure cooker tester and a tensile strength retention rate was calculated according to the formula given below. It should be construed that the larger the value of tensile strength retention rate, the better the hydrolysis resistance of the liquid crystalline polyester.

(Tensile strength retention rate)=(tensile strength of specimen after treatment)×100/(tensile strength of specimen before treatment)

In the formula, the specimen after treatment means a specimen obtained by allowing a specimen to stand for 100 hours under an environment at a temperature of 120° C. and a relative humidity of 100%, followed by allowing it to stand for 24 hours under an environment at a temperature of a temperature of 23° C. and a relative humidity of 100%. The specimen before treatment means a specimen obtained by allowing it to stand for 72 hours under an environment at 23° C. and a relative humidity of 100%.

Manufacturing Example 1

Into a reactor equipped with an agitator, a torque meter, a nitrogen gas inlet tube, a thermometer and a reflux condenser, 2-hydroxy-6-naphthoic acid 282.3 g (1.5 moles), 4,4'-dihydroxydiphenyl ether 166.8 g (0.825 moles), 2,6-naphthalenedicarboxylic acid 162.1 g (0.75 moles) and acetic anhydride 369.8 g (3.62 moles) were introduced. After the reactor was purged fully with nitrogen gas, the temperature was raised to 150° C. over 15 minutes under nitrogen gas flow, and reflux was performed for 3 hours while the temperature being held.

Subsequently, the temperature was raised to 320° C. over 170 minutes, while distilling by-product acetic acid and unreacted acetic anhydride were evaporated. When increase in torque was recognized, the reaction was considered to have terminated, and then the content was removed out. The resulting solid matter as cooled to room temperature, ground with a coarse grinder, and then held at 250° C. for 3 hours under nitrogen atmosphere to forward polymerization reaction in solid phase. Thus, a power was obtained.

Manufacturing Example 2

Into a reactor equipped with an agitator, a torque meter, a nitrogen gas inlet tube, a thermometer and a reflux condenser, 2-hydroxy-6-naphthoic acid 191.8 g (1.02 moles), 4,4'-dihydroxybiphenyl 63.3 g (0.34 moles), isophthalic acid 56.5 g (0.34 moles) and acetic anhydride 191 g (1.87 moles) were introduced. After the reactor was purged fully with nitrogen gas, the temperature was raised to 150° C. over 15 minutes under nitrogen gas flow, and reflux was performed for 3 hours while the temperature being held.

Subsequently, the temperature was raised to 320° C. over 170 minutes, while distilling by-product acetic acid and unreacted acetic anhydride were evaporated. When increase in torque was recognized, the reaction was considered to have terminated, and then the content was removed out. The resulting solid matter was cooled to room temperature, ground with a coarse grinder, and then held at 250° C. for 3 hours under nitrogen atmosphere to forward polymerization reaction in solid phase. Thus, a power was obtained.

Example 1

A 2-mm thick specimen was prepared by pressing the powder obtained in Manufacturing Example 1 under a load of 100 kgf at 325° C. for 10 minutes.

The resulting specimen was measured for a dielectric constant by an impedance material analyzer made by Hewlett-Packard Development Company, L.P. It had a relative dielectric constant of 2.8 (frequency: 1 GHz). A 0.3-mm thick specimen molded was prepared by using the powder obtained in Manufacturing Example 1 and it was subjected to a pressure cooker test. The specimen was found to have a tensile strength retention rate of 96%.

Example 2

By mixing 1 g of the powder obtained in Manufacturing Example 1 and 9 g of p-chlorophenol, followed by heating to 170° C., a completely dissolved liquid composition was yielded. The liquid composition, which was agitated and defoamed first, was cast on a 18-μm thick copper foil by a bar coating method, followed by heat treatment at 100° C. for 1 hour and additionally at 250° C. for 1 hour. Thus, a flexible laminate having a layer composed of a film of the present invention and a layer of electric conductor was produced.

Comparative Example 1

A 2-mm thick specimen was prepared by pressing the powder obtained in Manufacturing Example 2 under a load of 100 kgf at 310° C. for 10 minutes. The resulting specimen was measured for a dielectric constant by an impedance material analyzer made by Hewlett-Packard Development Company, L. P. It had a relative dielectric constant of 3.1 (frequency: 1 GHz). A 0.3-mm thick specimen molded was prepared by using the powder obtained in Manufacturing Example 2 and it was subjected to a pressure cooker test. The specimen was found to have a tensile strength retention rate of 56%.

What is claimed is:

1. A liquid crystalline polyester consisting essentially of a repeating unit represented by formula ($A_3$), as shown below:

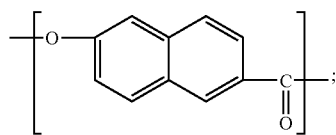

(A3)

at least one repeating unit selected from units represented by formula ($B_1$) and ($B_3$) respectively, as shown below:

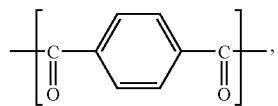

(B1)

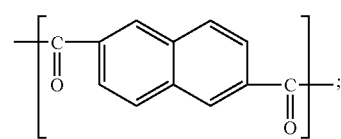

(B3)

and a repeating unit represented by formula ($C_1$), as shown below:

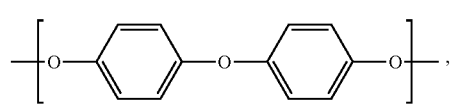

(C1)

wherein the amount of repeating unit ($A_3$) is from about 45 to about 65 mol%, the total amount of repeating units ($B_1$) and ($B_3$) is from about 27.5 to about 17.5 mol%, and the amount of repeating unit ($C_1$) is from about 27.5 to about 17.5 mol%, each based on the total molar amount of ($A_3$), ($B_1$) ($B_3$), and ($C_1$), and wherein the ratio of the total amount of repeating unit ($B_1$) and ($B_3$) to the amount of repeating unit ($C_1$) is about 1.

2. The liquid crystalline polyester according to claim 1, wherein the amount of repeating unit ($A_3$) is from 45 to 50 mol%, the total amount of repeating units ($B_1$) and ($B_3$) is from 27.5 to 25 mol%, and the amount of repeating unit ($C_1$) is from 27.5 to 25 mol%, each based on the total molar amount of ($A_3$), ($B_1$), ($B_3$) and ($C_1$).

3. A film comprising the liquid crystalline polyester according to claim 1.

4. A laminate comprising a layer composed of the film according to claim 3.

5. The laminate according to claim 4 further comprising a layer having an electric conductor.

6. A liquid composition comprising the liquid crystalline polyester according to claim 1, and a solvent.

7. The liquid composition according to claim 6, wherein the solvent comprises an aprotic solvent.

8. The liquid composition according to claim 6, wherein the solvent comprises an amide solvent.

9. The liquid composition according to claim 6, wherein the solvent comprises a protic solvent.

10. The liquid composition according to claim 6, wherein the solvent comprises a halogen-substituted phenol compound represented by formula ($L_1$) below:

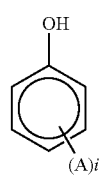

(L1)

wherein A represents a hydrogen atom or a trihalogenated methyl group, and i represents an integer number of from 1 to 5.

11. A film obtained by casting the liquid composition according to claim 1 on a support, removing the solvent, carrying out heat treatment, and then peeling away the support.

12. A laminate comprising a layer composed of the film according to claim 11.

13. The laminate according to claim 12 further comprising a layer having an electric conductor.

14. A molded article comprising the liquid crystalline polyester according to claim 1.

* * * * *